US 6,690,764 B2

(12) United States Patent
Kondo (10) Patent No.: US 6,690,764 B2
(45) Date of Patent: Feb. 10, 2004

(54) X-RAY SOURCES THAT MAINTAIN PRODUCTION OF ROTATIONALLY SYMMETRICAL X-RAY FLUX DURING USE

(75) Inventor: Hiroyuki Kondo, Kanagawa (JP)

(73) Assignee: Nikon Corporation, Tokyo (JP)

( * ) Notice: Subject to any disclaimer, the term of this patent is extended or adjusted under 35 U.S.C. 154(b) by 204 days.

(21) Appl. No.: 09/817,900

(22) Filed: Mar. 26, 2001

(65) Prior Publication Data

US 2002/0001363 A1 Jan. 3, 2002

(30) Foreign Application Priority Data

Mar. 24, 2000 (JP) ...................................... 2000-084941

(51) Int. Cl.[7] ............................................... G21G 4/00
(52) U.S. Cl. ......................................... 378/119; 378/84
(58) Field of Search ................................. 378/119, 143, 378/84

(56) References Cited

U.S. PATENT DOCUMENTS 5,199,054 A * 3/1993 Adams et al. ............... 378/143
6,285,743 B1 * 9/2001 Kondo et al. ............... 378/119
6,324,255 B1 * 11/2001 Kondo et al. ............... 378/119
6,339,634 B1 * 1/2002 Kandaka et al. ............ 378/119

* cited by examiner

Primary Examiner—Harshad Patel
(74) Attorney, Agent, or Firm—Klarquist Sparkman, LLP (57) ABSTRACT

Apparatus and methods are disclosed for producing a flux of X-rays, from a plasma, wherein the flux remains rotationally symmetrical about a propagation axis over a period of use, even if the plasma produce flying debris. The plasma can be generated by a laser-plasma source or a discharge-plasma source, for example. The X-rays produced by the plasma are directed by an optical element to a downstream location. To such end, the optical element is located where it is subject to deposition and accumulation of flying debris from the plasma. The optical element has an axis of rotational symmetry. A rotational actuator is situated relative to the optical element and is configured to rotate the optical element about the axis of rotational symmetry during use. Hence, if deposits of flying debris form on the optical element, the deposits will be rotationally symmetrical and thus have an identical affect on the X-ray flux at any angle about the axis of rotational symmetry.

25 Claims, 5 Drawing Sheets

X-RAY SOURCES THAT MAINTAIN PRODUCTION OF ROTATIONALLY SYMMETRICAL X-RAY FLUX DURING USE

FIELD OF THE INVENTION

This invention pertains to, inter alia, X-ray sources, more specifically to X-ray sources useful for any of various X-ray apparatus such as X-ray microscopes, X-ray analysis devices, and X-ray microlithography apparatus. Even more specifically, the invention pertains to X-ray sources that produce X-rays from a plasma produced by a target material highly energized by laser pulses or electrical discharge.

BACKGROUND OF THE INVENTION

Laser-plasma X-ray sources (hereinafter abbreviated as "LPX" sources) produce X-rays from a plasma generated by focusing a pulsed laser light on a target material situated inside a vacuum chamber. The laser light pulses convert the target material into the plasma, from which the X-rays are produced. LPX sources are small but nevertheless generate X-rays having an intensity comparable to the intensity of X-rays produced by undulators. Other small X-ray sources include dense plasma focus (DPF) sources that produce X-rays from an electrically produced discharge plasma. DPF sources also produce large quantities of X-rays, and have a higher conversion efficiency of X-rays to input power, and are lower in cost, than LPX sources.

In LPX and DPF sources, the target material and any other material located in or near the plasma are atomized, ionized, or generally fragmented (the products of such fragmentation are termed herein "flying debris"). The particles of flying debris propagate to neighboring components (e.g., X-ray optical elements) to which the debris adheres and on which the debris accumulates. These deposits diminish the performance (e.g., reflectivity or transmissivity) of the components. Also, collisions of particles of the flying debris with neighboring optical components damage the components.

According to one conventional approach to reducing the problem of flying debris in LPX sources, the target material is a gas at room temperature (e.g., nitrogen, carbon dioxide, krypton, and xenon). The gaseous target material is discharged from a nozzle while a pulsed beam of laser light is being irradiated onto the discharge stream of gas. According to another approach, the discharged target material is configured as a gaseous cluster produced by adiabatic expansion. Because they are gaseous, target materials produced in such manners tend not to accumulate on neighboring optical components. However, the plasma itself produces and emits high-velocity atoms, ions, and electrons that collide with the discharge nozzle and with components near the discharge nozzle. These collisions erode the nozzle and the components, producing flying debris that propagates to surrounding regions and accumulates on neighboring optical components. Consequently, an LPX source that produces no flying debris has yet to be realized.

Meanwhile, to decrease the rate at which flying debris is produced in LPX and DPF sources, efforts have been made to fabricate components of these sources (such as nozzles and electrodes) using materials having high melting points and high hardness, such as tungsten or tantalum. Another approach has been to decrease the operating voltage of the source. Unfortunately, neither approach has resulted in zero flying debris.

In addition, flying debris is not emitted uniformily in all directions. Rather, the particles tend to be emitted preferentially according to a certain asymmetric angular distribution. For instance, in LPX sources that utilize a gas-jet nozzle, fewer particles of flying debris propagate in the gas-discharge direction (i.e., along the gas-discharge axis). The quantity of flying debris increases with increases in the angle from the discharge axis.

Figure 7A:
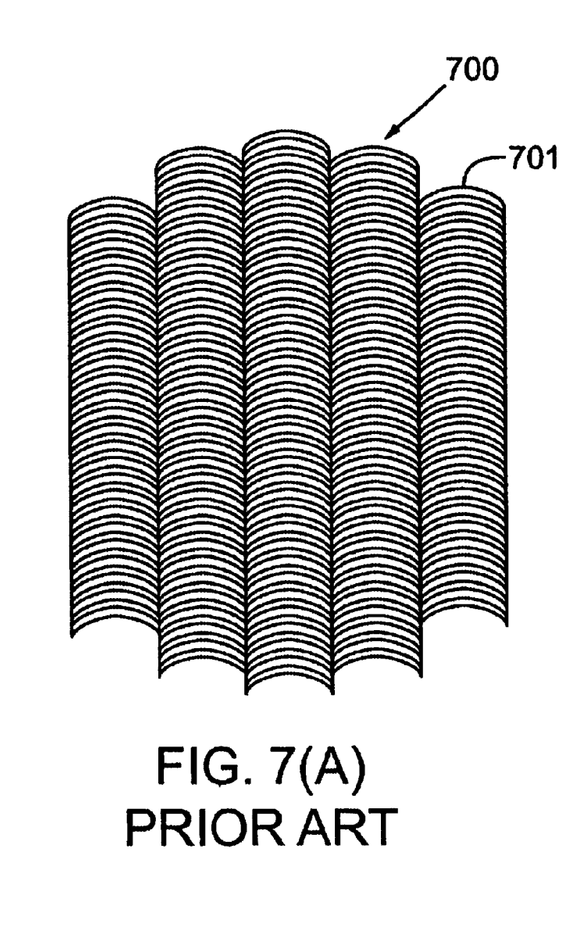
FIG. 7(A) is a plan view of a fly-eye mirror as used in a conventional X-ray optical system as used in an X-ray microlithography apparatus.
Figure 7B:
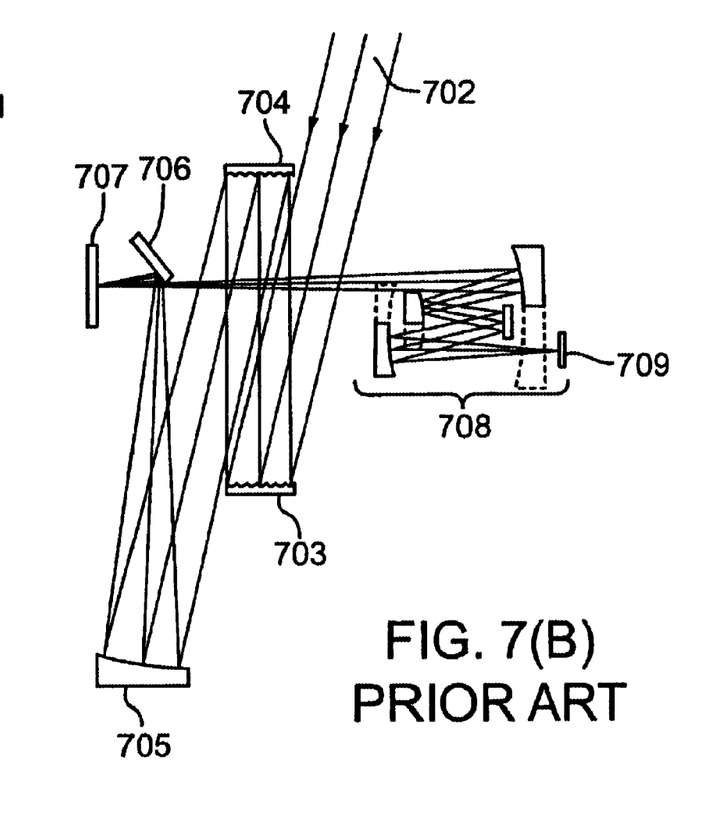
FIG. 7(B) is a schematic diagram of the optical system in a conventional X-ray microlithography apparatus.

For X-ray illumination purposes as exploited in X-ray microlithography apparatus, for example, illumination-optical systems have been proposed that utilize fly-eye mirrors. In this regard, reference is made to FIG. 7(B) depicting a system that receives a collimated beam 702 of X-rays that is reflected successively from two fly-eye mirrors 703, 704 before being reflected by illumination mirrors 705–706 to a reflective reticle 707. From the reticle 707, the X-rays are reflected by a projection-mirror array 708 to a substrate 709. As shown in FIG. 7(A), a typical fly-eye mirror 700 comprises multiple arc-shaped micro-elements grouped together. Each fly-eye mirror, such as that shown in FIG. 7(A), facilitates the achievement of a constant X-ray intensity distribution at the reticle 707. (See Japan Kôkai Patent Document No. Hei 11-312638). If X-rays incident to a fly-eye mirror have an axially symmetric distribution of X-ray intensity around the center axis of the fly-eye mirror, then the beamlets of reflected X-ray light from the various micro-elements of the fly-eye mirror reinforce each other and make uniform the intensity distribution of X-ray light at the reticle. However, if the X-ray beam incident to the fly-eye mirror is asymmetric around the center axis of the fly-eye mirror, then the fly-eye mirror will not adequately compensate for intensity variations of the incident beam. Consequently, the intensity distribution of the X-ray beam reflected from the fly-eye mirror will not be uniform at the reticle.

The angular distribution of X-rays radiated from a gas-nozzle LPX generally is rotationally symmetric around the gas-discharge axis. If a paraboloidal mirror (i.e., a mirror having a reflective surface configured as a paraboloid of revolution) were situated such that its axis of revolution is coincident with the gas-discharge axis, then X-rays reflected by the paraboloidal mirror should be a collimated beam having an intensity distribution nearly symmetrical to the gas-discharge axis. Thus, an X-ray flux suitable for the illumination-optical system described above could be formed. However, the angular distribution, relative to the gas-discharge axis, of emitted flying debris typically is not symmetrical. Rather, the angular distribution of the flying debris depends upon the plasma producing the debris and on the position of the nozzle (in the case of a gas-discharge LPX source) or the electrode (in the case of a discharge-plasma DPF source).

As a result of the phenomena summarized above, operation of an X-ray source for a long period of time is accompanied by a progressively more asymmetric distribution of X-ray intensity produced by the source, due to the axially asymmetric accumulation of flying debris on neighboring optical components. With respect to use of such a source in an X-ray microlithography apparatus, this asymmetric distribution of X-rays results in variations in the axial distribution of X-rays illuminating a reticle, with corresponding inaccuracies in the transfer of a reticle pattern to a substrate.

SUMMARY OF THE INVENTION

In view of the shortcomings of conventional apparatus and methods as summarized above, an object of the invention is to make any deposits of flying debris on an X-ray optical component situated adjacent the X-ray source rotationally symmetric about a propagation axis of the X-rays. Thus, the intensity distribution of the X-ray flux from the source is maintained rotationally symmetric, even in situations in which the X-ray source exhibits an asymmetrical distribution of emissions of flying debris.

Another object is to provide X-ray optical systems, situated adjacent the X-ray source, configured to rotate one or more neighboring optical components about the optical axis (propagation axis) of the X-ray beam. As a result, in the context of X-ray microlithography for example, the intensity distribution of the X-ray beam at the reticle remains uniform about the optical axis. In an X-ray microlithography apparatus, this axial uniformity of the beam allows the reticle pattern to be transferred accurately to the substrate.

To such ends, and according to a first aspect of the invention, X-ray sources are provided that generate X-rays from a plasma produced by directing pulsed laser light onto a target material in a vacuum chamber evacuated to a subatmospheric pressure. An embodiment of such a source includes a device for directing an X-ray flux from the plasma to a downstream optical system. The device comprises an optical element contained in the vacuum chamber and situated such that X-rays from the plasma are incident on the optical element. The optical element has an axis of rotational symmetry and is configured to direct the X-ray flux to the downstream optical system. The device also comprises a rotational actuator situated relative to the optical element and configured to rotate the optical element about the axis.

By rotating the optical element, the distribution of any deposited flying debris on the optical element is rotationally symmetric. As a result, for example, even if the angular distribution of produced flying debris is asymmetric, the intensity distribution of the X-rays propagating from the optical element is axially symmetric.

In this embodiment, the optical element can be, for example, an X-ray reflective mirror. The X-ray reflective mirror can be, for example, a multi-layer mirror, a grazing-incidence mirror, a spherical mirror, a paraboloidal mirror, a planar mirror, an ellipsoidal mirror, or an a spherical mirror. Stated another way, the mirror can comprise a reflective surface having, for example, any of the following profiles: spherical, paraboloidal, planar, ellipsoidal, or a spherical, or any combination of these profiles. Alternatively, the optical element can be an optical filter or a diffractive element.

This embodiment can include a position detector, a controller, and a positional actuator. The position detector is situated and configured to detect a position of the optical element, and is connected to the controller. The positional actuator, to which the optical element is mounted, also is connected to the controller. The positional actuator is configured, when commanded by the controller, to move the optical element as required for maintaining a desired position of the optical element, based on a signal from the position detector. The positional actuator can comprise an X-direction linear stage, a Y-direction linear stage, and a Z-direction linear stage. It also can include a device for tilting the optical element to realign the axis of rotational symmetry of the element with another axis, such as the propagation axis of the X-rays propagating from the element. The position detector can have any of several possible configurations, such as a contact-needle displacement gauge or a device employing a laser and a light receiver (e.g., photodiode). In the latter instance, the laser is directed at the optical element and the light receiver is oriented so as to receive laser light reflected from the optical element. In any event, with an X-ray source including these features, any variation of the orientation of the optical axis of the X-ray flux can be maintained within specified tolerances during rotation of the optical element.

According to another aspect of the invention, X-ray sources are provided. An embodiment of such a source comprises a vacuum chamber, an X-ray generator, an optical element, and an actuating device. The X-ray generator is situated within the vacuum chamber and is configured to produce a plasma sufficiently energized so as to produce X-rays. The optical element is contained in the vacuum chamber and is situated such that X-rays from the plasma are incident on the optical element. The optical element has an axis of rotational symmetry and is configured to direct the X-ray flux in a downstream direction (such as to an X-ray optical system). The actuating device is situated relative to the optical element and is configured to rotate the optical element about the axis. The X-ray generator can be, for example, a laser plasma X-ray device or a plasma-discharge X-ray device. As noted above, the optical element can be an X-ray reflective mirror or an optical filter (e.g., a filter transmissive to X-rays but not to visible light). This embodiment also can include a position detector, a controller, and a positional actuator as summarized above.

According to another aspect of the invention, X-ray optical systems are provided that include any of the X-ray sources summarized above.

The foregoing and additional features and advantages of the invention will be more readily apparent from the following detailed description, which proceeds with reference to the accompanying drawings.

DETAILED DESCRIPTION

Certain embodiments of X-ray sources according to the invention generate X-rays from a plasma produced by focusing pulsed laser light on a target material inside a reduced-pressure chamber. Other embodiments generate X-rays from a plasma produced by converting a target material into a plasma using an electrical discharge. An X-ray optical element is used to receive the X-rays from the plasma and guide the X-rays to a downstream X-ray optical system.

First Representative Embodiment

Figure 1:
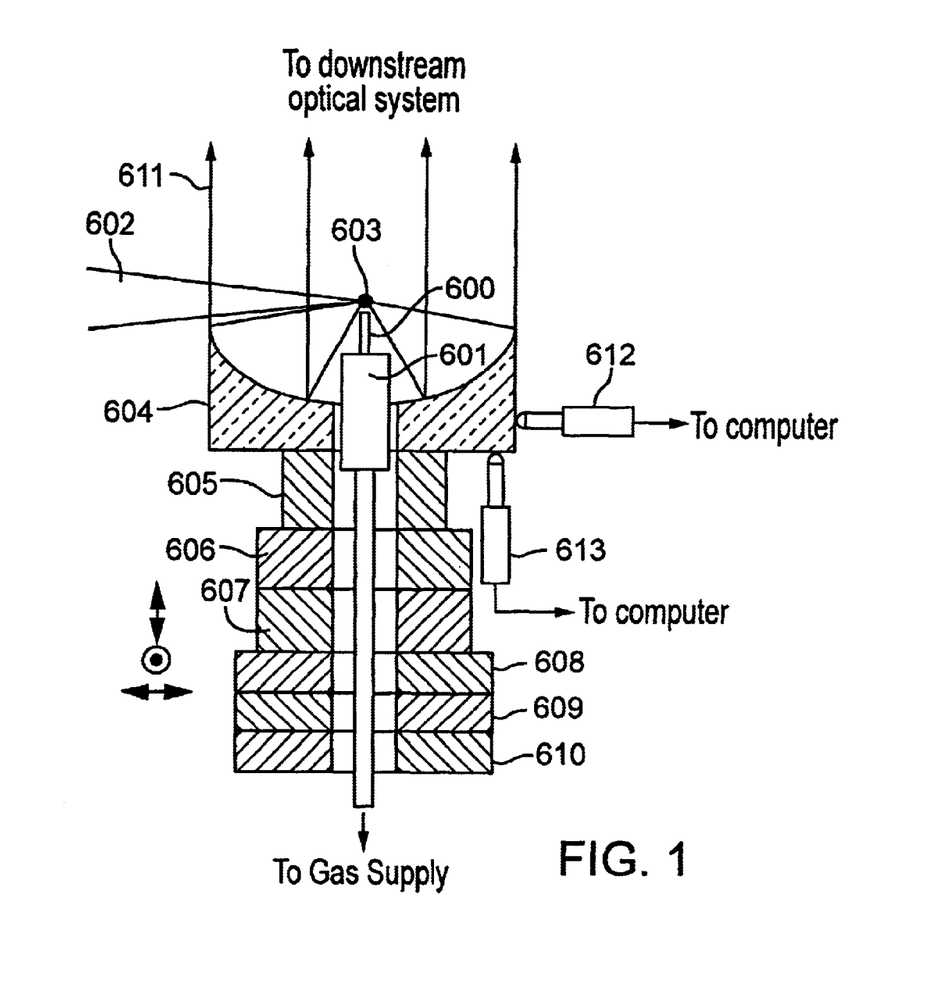
FIG. 1 is a schematic elevational view of an LPX X-ray source according to the first representative embodiment.

This embodiment is depicted in FIG. 1. The X-ray source is an LPX source. X-rays are produced from a plasma 603 generated by discharging a target gas from a nozzle 600 at ultrasonic velocity while irradiating the discharged target gas with a pulsed laser light 602. Discharge of target gas through the nozzle 600 is controlled by a pulse valve 601. The generated X-rays have a nearly uniform intensity distribution within a plane parallel to the laser-incidence plane (a horizontal plane in the figure).

A paraboloidal mirror 604 having a focal point in the middle of the plasma is situated as shown in the figure. The paraboloidal mirror 604 reflects the X-rays emitted from the plasma 603 and produces a collimated X-ray light flux 611 having an axially symmetric intensity distribution. The paraboloidal mirror 604 also directs the X-ray light flux 611 toward a downstream optical system. The paraboloidal mirror 604 is coated with multiple thin-film layers so as to be reflective to X-rays having a specified wavelength. The multi-layer period varies in a controlled manner across the reflective surface of the mirror 604 so as to maximize the reflectivity of the mirror at various locations on the mirror surface. The axis of rotational symmetry of the paraboloid is oriented so as to pass through the center of the plasma 603. Thus, the rotational axis of the paraboloidal mirror 604 is coincident with the optical axis of X-rays reflected from the mirror 604 (this optical axis is the axis of symmetry of the X-ray source).

A rotational actuator 605 is situated relative to the paraboloidal mirror 604 and is configured to rotate the mirror 604 about its axis of rotational symmetry. The rotational actuator 605 is mounted via linear stages 608, 609, 610 on tilt stages 606, 607. The tilt stages 606, 607 are oriented perpendicularly to one another. The linear stages 608, 609, 610 also are oriented perpendicularly to one another in three dimensions. The combination of the tilt stages 606, 607 and linear stages 608–610 are a representative example of various mechanisms that can be utilized for accurately positioning and rotating the mirror 604.

Contact-type displacement sensors 612, 613 are mounted, with respective orientations that are perpendicular to each other, on the side and rear surfaces (in the figure) of the paraboloidal mirror 604. (The direction orthogonal to the plane of the page is not depicted.) The particular configuration of the depicted displacement sensor 612 is exemplary only. Any of various types of displacement sensors can be employed. To facilitate displacement sensing, the side and rear surfaces (in the figure) of the paraboloidal mirror 604 extend very accurately parallel and perpendicular, respectively, to the axis of rotational symmetry of the mirror 604. The output of each displacement sensor 612, 613 is routed to a computer or other processor (not shown but well understood in the art) as a representative controller. During rotation of the mirror 604, any change in the rotational axis of the mirror 604 is detected by the displacement sensors 612, 613 as a corresponding shift in mirror position. Data from the displacement sensors 612, 613 are processed by the computer. If the computer determines that the magnitude of shift exceeds applicable specifications, then the computer initiates actuation of the tilt stages 606, 607 and/or the linear stages 608, 609 to return the mirror position to within specification.

Thus, by providing in this embodiment respective devices for detecting mirror position, for controlling mirror position, and for actuating a drive mechanism to restore proper mirror position, displacement of the optical axis of X-rays reflected by the rotating mirror 604 is maintained within specification so as to ensure that any flying debris deposited on downstream optical components is distributed uniformly about the axis. If the accuracy of the mirror-rotation mechanism is sufficiently high for maintaining axial displacement of the rotating mirror within the maximal angular spread of the X-ray light flux accommodated by the downstream optical system, then the devices for detecting mirror position, controlling mirror position, and actuating drive mechanisms to restore mirror position can be omitted.

Second Representative Embodiment

Figure 2:
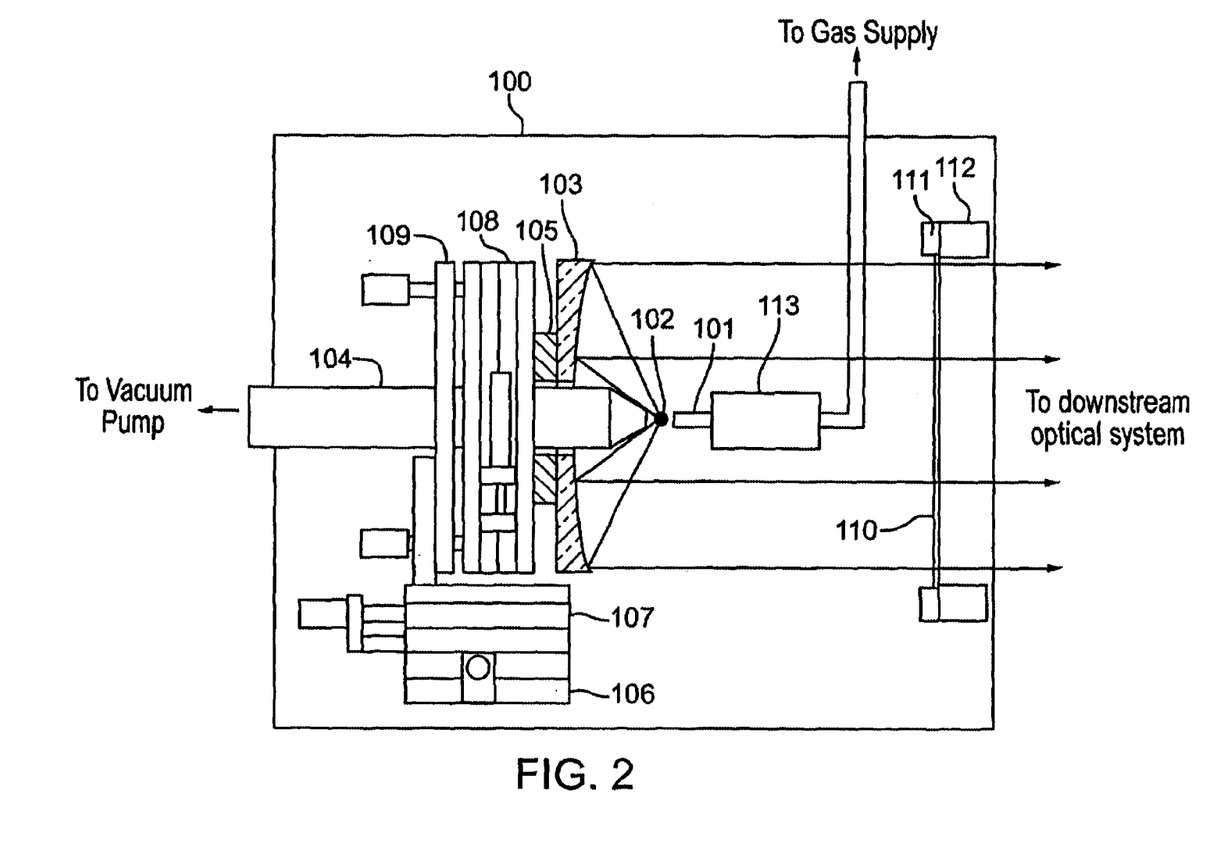
FIG. 2 is a schematic elevational view of an LPX X-ray source according to the second representative embodiment.

An X-ray source (LPX source) according to this embodiment is shown in FIG. 2. X-rays are generated by a plasma produced by irradiation of laser light on a gaseous target material. The X-ray source is contained within a chamber 100 defining an interior space evacuated by a vacuum pump (not shown but well understood in the art). The pressure of the interior space is reduced to a level at which X-rays radiating from the plasma are not absorbed or excessively attenuated en route. The target-gas-delivery device in this embodiment is a gas nozzle 101 (desirably made of an inert metal such as stainless steel) from which the target gas (e.g., krypton) is discharged. Discharge from the gas nozzle 101 is controlled by a pulse valve 113. Target gas discharged from the nozzle 101 that is not converted into the plasma is evacuated to the external environment through an evacuation port 104 located axially opposite the nozzle 101 and connected to the vacuum pump. Any other target gas circulating in the vacuum chamber 100 is evacuated through the vacuum port 104 by the vacuum pump discussed above.

The laser is incident along an optical axis, passing through the center of the plasma 102, extending perpendicularly to the plane of the page of FIG. 2. I.e., the laser pulses are incident at the plasma 102 from below the plane of the page along an axis perpendicular to the plane of the page. Pulsed laser light emitted from the laser device (not shown but well understood in the art) is focused by a condenser lens (not shown) at a position 0.5 mm from the tip of the nozzle 101, along the axis of the nozzle, to produce the plasma 102. The shape of the plasma 102 is filamentous, with a length of approximately 300 $\mu$m along the optical axis of the laser and approximately 100 $\mu$m perpendicular to the optical axis of the laser. The plasma 102 is produced approximately 500 $\mu$m toward the condenser lens from directly in front of the nozzle 101.

A paraboloidal mirror 103 and the nozzle 101 are situated such that the plasma 102 is formed substantially at the focal point of the mirror 103. Regarding the X-rays emitted from the plasma 102, only those X-rays of a specified wavelength (e.g., 13 nm) are reflected by the mirror 103. To such end, the paraboloidal mirror 103 is coated with multiple thin-film layers. X-rays reflected from the mirror 103 are collimated and pass through a filter 110 that is opaque to visible light but transmissive to X-rays. By way of example, the filter 110 comprises a thin film of zirconium (Zr), 150 nm thick, formed on a mesh of nickel (Ni). The mesh is supported by a holder 111. The X-rays passing through the filter 110 propagate to a downstream X-ray optical system (not shown).

The mirror 103 is supported by a stage assembly, comprising an annular ultrasonic motor 105 situated and configured to rotate the paraboloidal mirror 103 around its axis of rotational symmetry. The stage assembly also comprises three axially orthogonal stages 106, 107, 108 for determining and controlling the position of the mirror 103, and a tilting stage 109 for controlling the inclination of the mirror 103. The stages 108, 109 are mounted behind the mirror 103, and the stages 106, 107 are displaced laterally from the stages 108, 109. The stages 106–109 can be driven by respective motors or other actuators from outside the vacuum chamber 100.

Figure 3A:
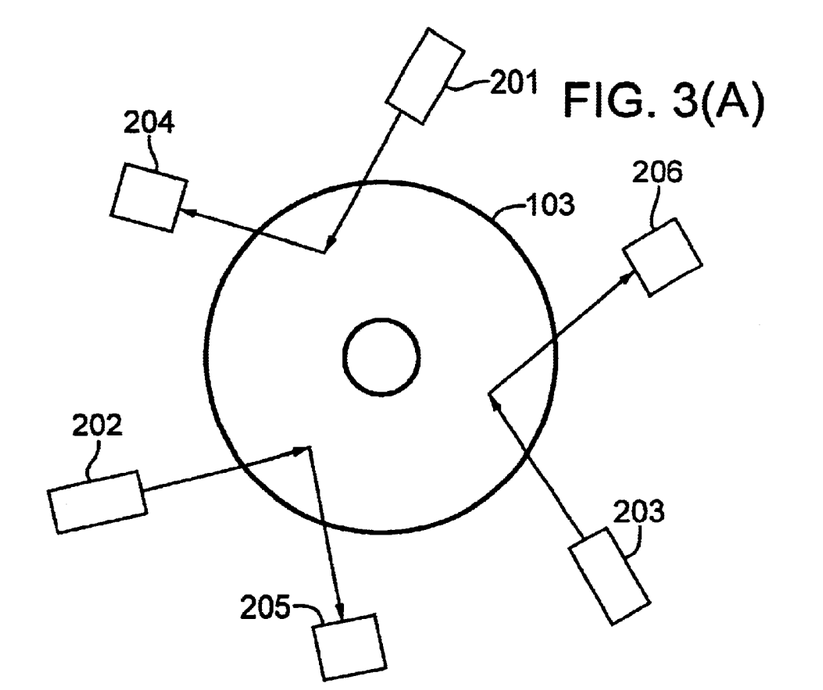
FIG. 3(A) is a plan view of the paraboloidal mirror (as viewed from a location on the mirror axis but downstream of the mirror) used in the second representative embodiment, showing the positions and orientations of semiconductor lasers and respective photodiodes used to detect mirror orientation.

In this embodiment, a set of multiple (desirably three) semiconductor lasers and respective photodiodes is used for detecting the position and inclination of the paraboloidal mirror 103. The semiconductor lasers and photodiodes are disposed adjacent the paraboloidal mirror 103 at positions that do not block X-rays reflected by the mirror 103. The semiconductor lasers are positioned at 120° relative to each other. The respective photodiodes also are positioned at 120° from each other, but angularly between the lasers. This scheme is depicted in FIG. 3(A) so as to be understood readily, wherein FIG. 3(A) represents a view, from a location on the mirror axis but downstream of the mirror 103, toward the mirror 103. A laser beam from the semiconductor laser 201 strikes a point on the surface of the paraboloidal mirror 103 and is reflected toward a respective photodiode 204. Respective laser beams from the other two semiconductor lasers 202, 203 are likewise reflected by the surface of the mirror 103 toward respective photodiodes 205, 206. Hence, the points on the surface of the mirror 103 irradiated by the laser beams are at 120° relative to each another.

Figure 3B:
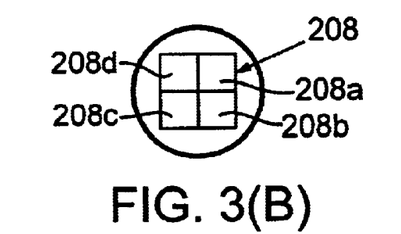
FIG. 3(B) is a plan view of the light-receiving surface of a photodiode as used in the configuration of FIG. 3(A).

Each photodiode 204, 205, 206 has a respective light-reception surface 208 that is partitioned into four portions 208a–208d, as shown in FIG. 3(B). Each portion produces a respective electrical signal from respective incident light of the reflected laser beam. These electrical signals are routed to the computer (discussed above).

In a situation in which the nozzle 101, the paraboloidal mirror 103, and the downstream optical system are all aligned with each other, the respective signals output from the photodiodes 204–206 (3 photodiodes×4 portions each= 12 signals) are received by, stored in, and processed by the computer. This situation represents an "initial state" of the system. Upon starting up this X-ray source, rotation of the paraboloidal mirror 103 commences, as effected by the ultrasonic motor 105. The rotational velocity of the mirror is a function of the rate at which flying debris from the plasma adhere to and accumulate on neighboring structures. If the rate of production of flying debris by the plasma is low, then a low rotational velocity is permissible. Conversely, higher-velocity rotation is necessary if the rate of particle adhesion is high. By way of example, the LPX of this embodiment tends to emit low quantities of flying debris, so the rotational velocity of the mirror 103 can be one revolution per hour.

In any event, if alignment of the mirror 103 shifts during rotation, then the positions at which the respective reflected laser beams from the semiconductor lasers 201–203 reach the respective photodiodes 204–206 change accordingly. These changes produce corresponding changes in the magnitudes of respective signals produced by the portions 208a–208d of the light-reception surface 208 in each photodiode 204–206. If the differences in electrical outputs from the portions 208a–208d of the light-reception surfaces in the photodiodes 204–206, relative to the initial conditions, exceeds predetermined thresholds, then the computer will detect an excessive misalignment of the mirror 103 and will cause the inclination stage 109 and the linear stages 106–108 to apply corrective positioning of the mirror 103 to return the electrical signals to within specifications.

In addition, the direction of mirror shift can be ascertained from the signal changes in the four portions 208a–208d of the respective light-reception surface 208 of each photodiode 204–206, allowing the stages 106–109 to be actuated appropriately to correct the shift. Hence, changes in the optical axis of the X-rays reflected from the mirror 103 are maintained within specifications so as not to have any adverse effect on downstream optical systems, even while rotating the mirror 103. In addition, there is no loss in the axial symmetry of the X-rays reflecting from the mirror 103, even if the angular distribution of the flying debris is asymmetrical.

In this embodiment, the X-ray filter 110 is located in the chamber 100. As a result, flying debris from the plasma also can accumulate on the filter 110. If the angular distribution of the flying debris is asymmetric, then the debris will accumulate asymmetrically on the filter 110. As a result, the flux of X-rays transmitted by the filter 110 will become asymmetric. Therefore, in this embodiment, an annular ultrasonic motor 112 (or analogous actuator) is installed on the perimeter of the holder 111 on which the X-ray filter 110 is mounted, so as to rotate the filter 110 around the center axis of the X-ray flux. The filter rotation prevents degradation of the symmetry of the transmitted X-ray flux, by ensuring that the quantity of flying debris accumulating on the filter 110 is axially symmetric relative to the X-ray optical axis. In this embodiment, since the rate of change in the transmissivity of the filter 110 is miniscule, even if some shift occurs in the rotational axis of the filter 110, a filter-position sensor is not normally necessary (and hence is not shown).

By rotating the filter 110 as described above, variations in the transmission of X-rays through the filter 110 can be ameliorated (e.g., variances arising by variances in the thickness of the filter material and/or of the mesh support members). This is especially effective whenever the X-ray source of this embodiment is used for performing microlithographic exposures, as in soft X-ray (EUV) microlithography apparatus and methods. The respective rotational velocities of the mirror 103 and filter 110 may be equal, or they may be different according to the operating status of the X-ray source. In addition, the respective directions of rotation of the mirror and filter may be the same or different.

Although a paraboloidal mirror 103 is used in this embodiment, it will be understood that the mirror alternatively can be a spherical mirror or an ellipsoidal mirror. The mirror also may be a rotationally symmetrical a spherical mirror. The mirror surface (whether spherical, paraboloidal, ellipsoidal, and/or a spherical) can be formed on a single substrate, or alternatively on a substrate divided into multiple segments conjoined into a single unit or situated adjacent one another.

In this embodiment, the light-receiving surface 208 of each photodiode 204–206 was divided into four portions 208a–208d. However, the number of portions is not limited to four. Alternatively, each light-receiving surface 208 can be divided into two, three, or more portions, or not divided at all. The photodiodes 204–206 can be one-dimensional (as in photodiode arrays), or two-dimensional (as in CCDs).

Although semiconductor lasers were used in this embodiment to measure displacements of the mirror 103, other measuring devices alternatively can be used such as contact-needle displacement gauges (see FIG. 1), over-current sensors, ultrasonic sensors, electrostatic capacity sensors, etc.

Figure 4:
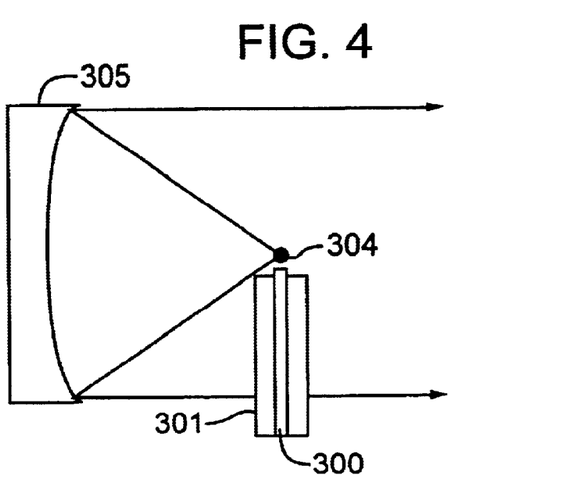
FIG. 4 is a schematic elevational view of an alternative configuration of the second representative embodiment, employing a DPF X-ray source.

The mirror can be disposed in any orientation relative to the plasma. FIG. 4 shows an example configuration employing a discharge-plasma X-ray source (dense-plasma focus, or DPF source). In FIG. 4, only the electrodes (anode 300, cathode 301) of the DPF source are shown, and the power supply is not shown. A multilayered paraboloidal mirror 305 is situated laterally adjacent the electrode. Also not shown are a mirror-drive mechanism and a device for detecting mirror position.

Figure 5:
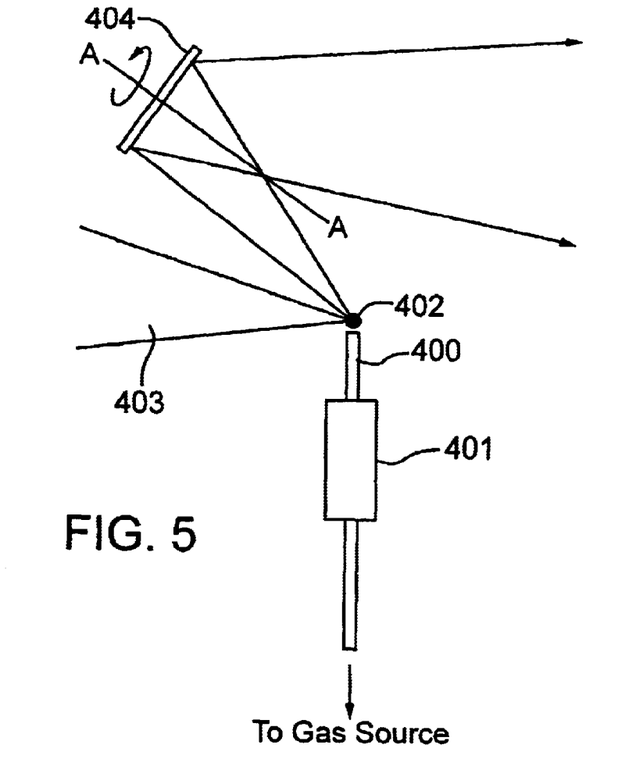
FIG. 5 is a schematic elevational view of another alternative configuration of the second representative embodiment, employing a planar mirror.

If the mirror is planar it can be rotated using the direction of a normal ray as an axis. FIG. 5 shows a situation in which a multilayer planar mirror 404 is used, together with a gas-jet LPX used to generate X-rays from a plasma 402. The multilayer planar mirror 404 is rotated about the normal-ray axis AA. Not shown are a mirror-drive mechanism and a device for detecting mirror position. A laser beam 403 is focused at the location of the plasma 402.

Figure 6:
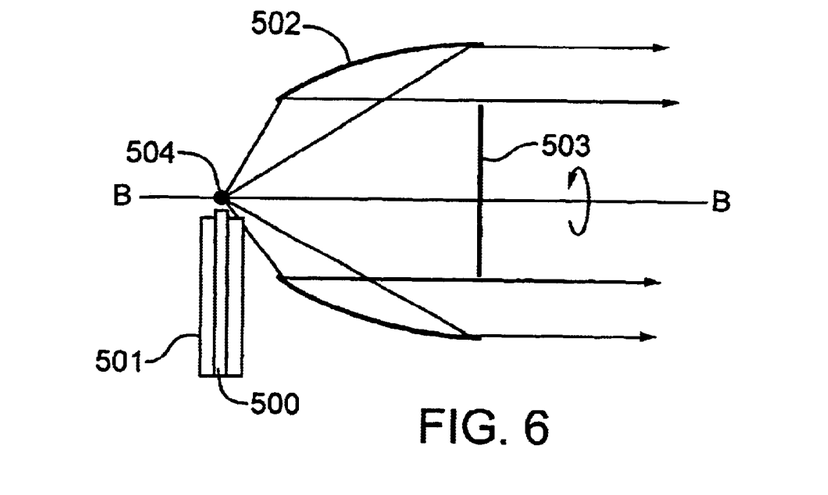
FIG. 6 is a schematic elevational view of yet another alternative configuration of the second representative embodiment, employing a paraboloidal grazing-incidence mirror.

Whereas a multilayer mirror is used in the embodiments described above, a grazing-incidence mirror alternatively can be used for achieving full reflection of incident X-rays. An example configuration employing a grazing-incidence paraboloidal mirror 502 is shown in FIG. 6, used in conjunction with a DPF for generating the X-rays. In this figure, only the electrodes (anode 500, cathode 501) of the DPF source are shown; the power supply is not shown. The DPF source produces a plasma 504 at the location shown, relative to the mirror 502.

In FIG. 6, the mirror 502 is rotated about its axis of symmetry (axis B—B), which is the propagation axis of X-rays reflected from the mirror 502. (The mirror-drive mechanism and device for detecting mirror position are not shown.) Although the mirror 502 has a paraboloidal reflective surface, the mirror 502 alternatively can have an ellipsoidal reflective surface or a reflective surface having a combination of these profiles (e.g., a Walter mirror). Item 503 is an axial beam stop useful for producing a collimated beam.

Although LPXs were used in several of the embodiments described above in which gas jets were used, LPXs employing mechanisms in which the target material is discharged in clusters, a liquid jet, liquid droplets, microdroplets, or microparticles alternatively can be used. The target material used for LPXs or discharge-plasma X-ray sources is not limited to krypton. Alternatively, the target material can be, e.g., xenon (Xe), carbon dioxide ($CO_2$), or lithium (Li), or a mixture or compound of any of these substances.

As an alternative to using a DPF source for generating X-rays, other configurations of discharge-plasma X-ray sources alternatively can be used. For example, a Z-pinch plasma source or a capillary-discharge plasma source can be used.

By employing a rotating reflective optical element (onto which X-rays generated from the plasma are initially incident), or other rotating optical element in the vicinity of the plasma, flying debris will accumulate in an axially symmetrical fashion on the optical element, even if the flying debris is emitted from the plasma in a spatially irregular distribution. As a result, the axial symmetry of the X-ray flux reflected or transmitted by the optical element is maintained. Consequently, there is no decrease in the performance of a downstream optical system requiring an axially symmetrical X-ray flux, even if the X-ray source is operated for a long period of time.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In an X-ray source that generates X-rays from a plasma produced by directing pulsed laser light onto a target material in a vacuum chamber evacuated to a subatmospheric pressure, a device for directing an X-ray flux from the plasma to a downstream optical system, comprising:
    an optical element situated such that X-rays from the plasma are incident on the optical element, the optical element having an axis of rotational symmetry and being configured to direct the X-ray flux to the downstream optical system; and
    a rotational actuator situated relative to the optical element and configured to rotate the optical element about the axis.

2. The device of claim 1, wherein the optical element is an X-ray reflective mirror.

3. The device of claim 2, wherein the mirror is selected from a group consisting of multi-layer mirrors, grazing-incidence mirrors, spherical mirrors, paraboloidal mirrors, planar mirrors, ellipsoidal mirrors, and a spherical mirrors.

4. The device of claim 2, wherein the mirror comprises a reflective surface having a profile selected from a group consisting of spherical, paraboloidal, planar, ellipsoidal, a spherical, and combinations thereof.

5. The device of claim 1, wherein the optical element is an optical filter or X-ray diffractive element.

6. The device of claim 1, further comprising:
    a position detector situated and configured to detect a position of the optical element;
    a controller to which the position detector is connected; and
    positional actuator connected to the controller and to which the optical element is mounted, the positional actuator being configured, when commanded by the controller, to move the optical element as required to maintain a desired position of the optical element, based on a signal from the position detector.

7. The device of claim 6, wherein the positional actuator comprises an X-direction linear stage, a Y-direction linear stage, and a Z-direction linear stage.

8. The device of claim 6, wherein the position detector comprises a contact-needle displacement gauge.

9. The device of claim 6, wherein the position detector comprises a light source directed at the optical element and a light receiver oriented so as to receive light reflected from the optical element, the light source being selected from the group consisting of lasers, light-emitting diodes, and lamps.

10. The device of claim 1, wherein the optical element is situated within the vacuum chamber.

11. An X-ray optical system including an X-ray source that generates X-rays from a plasma produced by directing pulsed laser light onto a target material in a vacuum chamber evacuated to a subatmospheric pressure, the X-ray optical system comprising a device as recited in claim 1.

12. An X-ray source, comprising:
    a vacuum chamber;
    an X-ray generator situated within the vacuum chamber and configured to produce a plasma sufficiently energized so as to produce X-rays;
    an optical element contained in the vacuum chamber and situated such that X-rays from the plasma are incident on the optical element, the optical element having an axis of rotational symmetry and being configured to direct the X-ray flux in a downstream direction; and
    an actuating device situated relative to the optical element and configured to rotate the optical element about the axis.

13. The X-ray source of claim 12, wherein the X-ray generator is a laser-plasma X-ray device.

14. The X-ray source of claim 12, wherein the X-ray generator is a plasma-discharge X-ray device.

15. The X-ray source of claim 12, wherein the optical element is an X-ray reflective mirror.

16. The X-ray source of claim 12, wherein the optical element is an optical filter.

17. The X-ray source of claim 12, further comprising:
    a position detector situated and configured to detect a position of the optical element;
    a controller to which the position detector is connected; and
    a positional actuator connected to the controller and to which the optical element is mounted, the positional actuator being configured, when commanded by the controller, to move the optical element as required to maintain a desired position of the optical element, based on a signal from the position detector.

18. The X-ray source of claim 17, wherein the positional actuator comprises an X-direction linear stage, a Y-direction linear stage, and a Z-direction linear stage.

19. The X-ray source of claim 17, wherein the position detector comprises a contact-needle displacement gauge.

20. The X-ray source of claim 17, wherein the position detector comprises a light source directed at the optical element and a light receiver oriented so as to receive light reflected from the optical element, the light source being selected from the group consisting of lasers, light-emitting diodes, and lamps.

21. An X-ray optical system, comprising an X-ray source as recited in claim 12.

22. In a method for producing an X-ray flux, propagating along a propagation axis, from a plasma generated by exciting a target material, a method for producing an X-ray flux that remains axially symmetrical despite production of flying particles by the plasma, the method comprising:
    providing an optical element situated so as to direct the X-ray flux, propagating from the plasma, to a downstream optical system, the optical element having an axis of rotation and being subject to deposition of particles of flying debris from the plasma; and
    rotating the optical element about the axis of rotation whenever X-rays are being produced by the plasma.

23. The method of claim 22, wherein the optical element is selected from a group consisting of X-ray reflective mirrors, X-ray diffractive elements, and filters.

24. The method of claim 22, further comprising the step of monitoring a position of the optical element as the optical element is rotated about the axis of rotation.

25. The method of claim 24, further comprising the step of correcting a position of the optical element whenever monitoring of the position of the optical element reveals a positional change that exceeds a preset specification.

* * * * *

UNITED STATES PATENT AND TRADEMARK OFFICE
CERTIFICATE OF CORRECTION

PATENT NO. : 6,690,764 B2
DATED : February 10, 2004
INVENTOR(S) : Hiroyuki Kondo It is certified that error appears in the above-identified patent and that said Letters Patent is hereby corrected as shown below:

Column 3,
Line 41, "an a spherical" should read -- an aspherical --

Column 8,
Line 45, "symmetrical a spherical" should read -- symmetrical aspherical --

Column 10,
Line 19, "and a spherical" should read -- and aspherical --
Lines 22-23, ", a spherical," should read -- , aspherical, --

Signed and Sealed this

Thirty-first Day of August, 2004

JON W. DUDAS
*Director of the United States Patent and Trademark Office*